United States Patent [19]

Niwayama

[11] Patent Number: 4,994,770

[45] Date of Patent: Feb. 19, 1991

[54] TONE CONTROL DEVICE

[75] Inventor: Masaki Niwayama, Hyogo, Japan

[73] Assignee: Mitsubishi Denki Kabushiki Kaisha, Tokyo, Japan

[21] Appl. No.: 424,350

[22] Filed: Oct. 19, 1989

[30] Foreign Application Priority Data

Oct. 21, 1988 [JP] Japan .................................. 63-266499

[51] Int. Cl.$^5$ ............................................. H03G 5/02
[52] U.S. Cl. .................................... 333/28 T; 381/98
[58] Field of Search ...................... 333/28 T; 381/68.2, 381/98, 101, 102

[56] References Cited

U.S. PATENT DOCUMENTS 3,816,661  6/1974  Huszty et al. ........................ 381/101
4,785,475  11/1988  Rimkeit et al. ............... 333/28 T X

OTHER PUBLICATIONS

*Parametric Equaliser,* Elektor, Sep. 1979, vol. 8, No. 9 pp. 9-26 to 9-33.
"LMC835 Digital Controlled Graphic Equalizer" *Linear Databook* 3 (National Semiconductor Corp., 1987), pp. 1-234 to 1-247.

*Primary Examiner*—Paul Gensler
*Attorney, Agent, or Firm*—Burns, Doane, Swecker & Mathis

[57] ABSTRACT

An improved tone control device for controlling a tone within an audio frequency range in a combined mode of fine compensation for frequency characteristic as in the graphic equalizer and coarse tone control as in the bass/treble tone control circuit by making use of corresponding circuits in common for the both control without increasing the scale of circuitry, whereby the audio frequency is divided into N and M (<N) bands and the first manipulation input is fed to each one of the N bands while the second manipulation input is fed to each one of the M bands, the second input is converted into weights for each band in the N bands as by increasing or decreasing the gain thereof with a conversion means and setting the gain of each band by utilizing a gain setting means in accordance with the amount of first manipulation input as well as the weighted gain for an intended tone control.

15 Claims, 10 Drawing Sheets

TONE CONTROL DEVICE

BACKGROUND OF THE INVENTION

1. Field of the Invention

The present invention relates to a tone control device and, more particularly, to a separated or built-in type tone control device for audio equipment providing with a frequency characteristic compensating function as well as a bass-treble type tone control function within the audio frequency range.

2. Description of the Prior Art

There are two major objects in the tone control function of prior art audio equipment.

As for the first object, if the played-back signal from a recording medium is converted into sound without making any compensation, the reproduced sound lacks fidelity to the original sound because the frequency characteristic of on the medium is not linear. Therefore, because of this nonline frequency transfer characteristic of media such as that used in recording, the transmission and the transformation must be compensated in order to reproduce a sound with fidelity to the original sound. The compensation has generally been made, for example, to the frequency transfer characteristic in a speaker or an acoustic space. In this method of compensation, the gain of finely divided frequency bands are independently controlled for attaining a flat frequency characteristic. A so called graphic equalizer is a known device for achieving this first object. In the graphic equalizer, the audio frequency band is normally divided into three or more bands and the gain of each band is controlled independently for the required compensation.

The second object is generally achieved through an artificial tone control to change the frequency characteristic for making low frequencies more abundant in sound or for making the sound with stimulating tone more comfortable to listen to. This type of tone control normally does not require complicated control of the frequency characteristic and is provided by a bass/treble type tone control circuit wherein the audio frequency range is divided roughly into two frequency bands of higher and lower parts and the control is done separately for the lower and higher frequency bands as they are defined as bass and treble control respectively.

Figure 1:
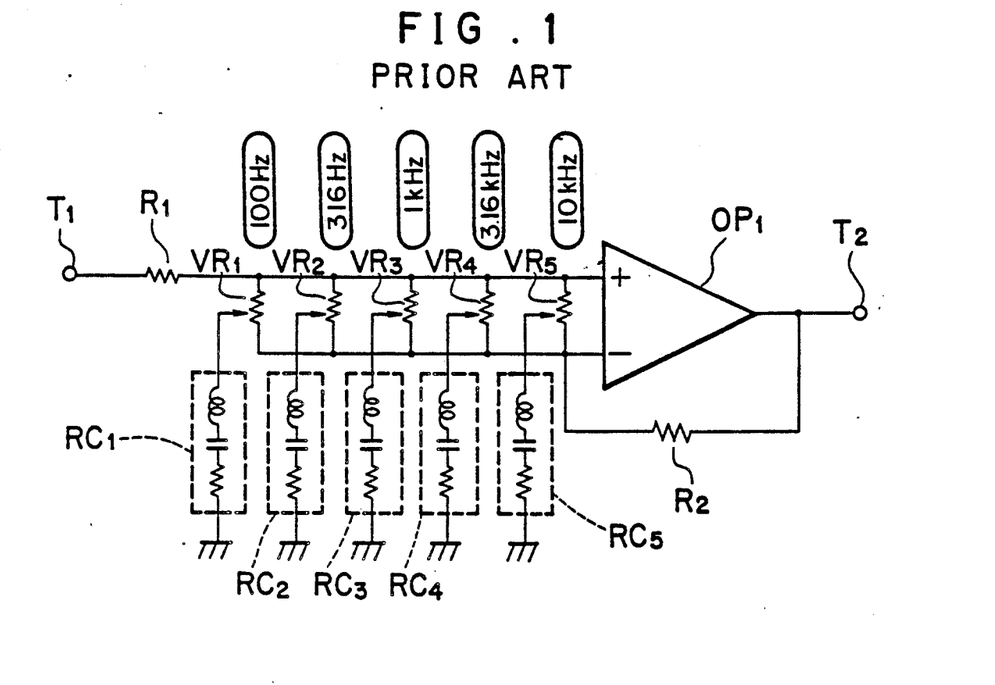
FIG. 1 is a circuit diagram showing a prior art graphic equalizer.

In FIG. 1, there is shown a circuit diagram of a prior art graphic equalizer, wherein OP1 denotes an operational amplifier, R1 is a resistor connected between an input terminal T1 and a non-inverting input terminal (hereinafter called "+" input terminal) of the operational amplifier OP1, VR1-VR5 are variable resistors connected in parallel to the "+" input terminal and an inverting input terminal (hereinafter called "−" input terminal) of the operational amplifier OP1 with their fixed resistance arms, and RC1-RC5 are series resonance circuits each of which consists of a coil, a capacitor and a resistor connected in series and connected between slide arms of the variable resistors VR1-VR5, respectively, and the ground. The series resonance circuits RC1-RC5 have resonance frequencies of 100 Hz, 316 Hz, 1 KHz, 3.16 KHz, and 10 KHz, respectively. Further in the FIG. 1, R2 is a feed back resistor connected between the "−" input terminal of the operational amplifier OP1 and an output terminal T2.

In accordance with this prior art arrangement, by applying an audio signal to the input terminal T1 and by controlling each of the variable resistors VR1-VR5, the gains of the five frequency bands which have the center frequencies of 100 Hz, 316 Hz, 1 KHz, 3.16 KHz, and 10 KHz respectively are varied and there is derived an audio signal having the frequency characteristic which conforms to the varied gains of the frequency bands from the output terminal T2 of the operational amplifier OP1. In this case, if the variable resistors are controlled in such a manner that the resistance at the "−" input terminal side of the operational amplifier OP1 becomes smaller in value as compared to the resistance at the "−" input terminal side, the gain for the corresponding frequency band is increased. Similarly, the gain is decreased if the direction of the control is reversed.

Figure 3:
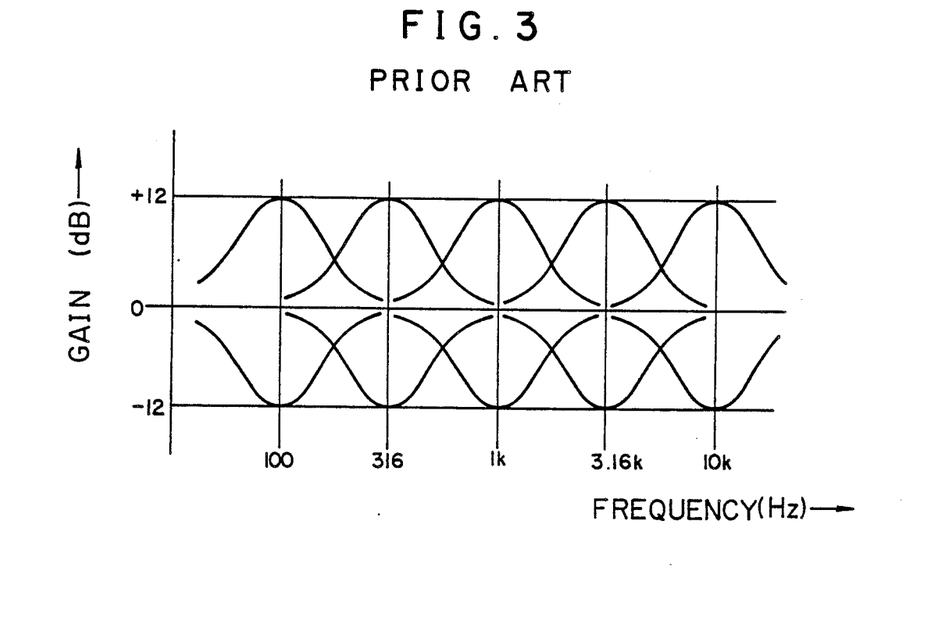
FIG. 3 is a diagram showing the frequency characteristics of the circuit shown in FIG. 1.

FIG. 3 is a diagram showing the change of frequency characteristics of the graphic equalizer of the type shown in FIG. 1, wherein the gain for each frequency band is varied between the maximum (12 dB) and the minimum (−12 dB) at the center frequency of each band.

Figure 2:
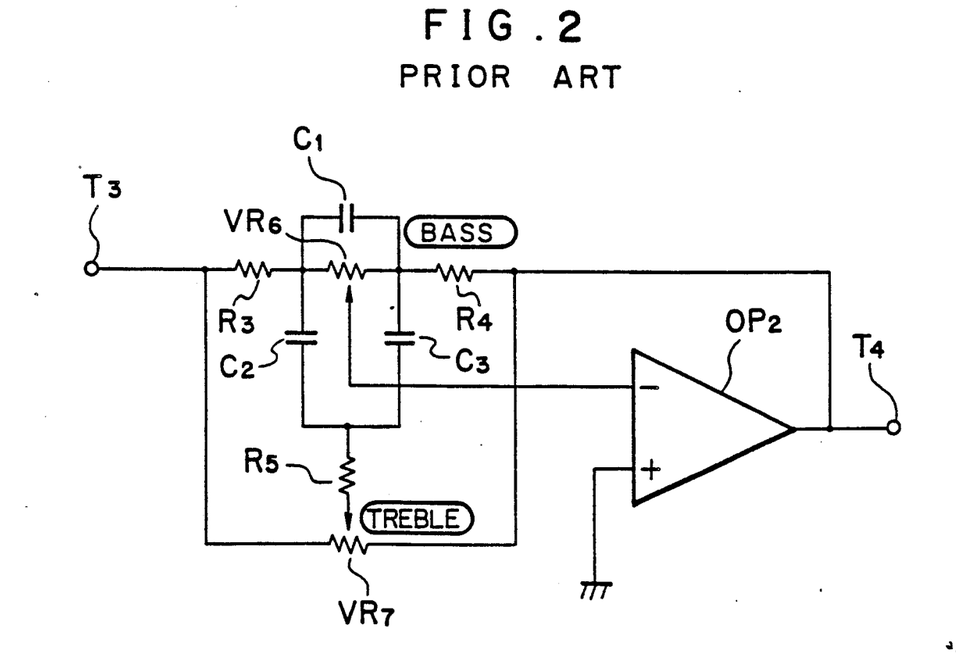
FIG. 2 is a circuit diagram showing a prior art bass/-treble tone control circuit.

FIG. 2 is a circuit diagram showing a conventional bass/treble type tone control circuit of the prior art. This type of tone control circuit consists of an input terminal T3, an output terminal T4, an operational amplifier OP2, a pair of resistors R3, R4, three capacitors C1-C3, a variable resistor VR6 for bass control, and a variable resistor VR7 for treble control.

In the arrangement above, the gain of a low frequency band of an audio input signal fed through the input terminal T3 is controlled by adjusting the variable resistor VR6 for bass control, and the gain of a higher frequency band thereof is controlled by adjusting the variable resistor VR7 for treble control, so that an audio output signal whose tone corresponds to these gains is produced at the output terminal T4 of the operational amplifier OP2.

Figure 4:
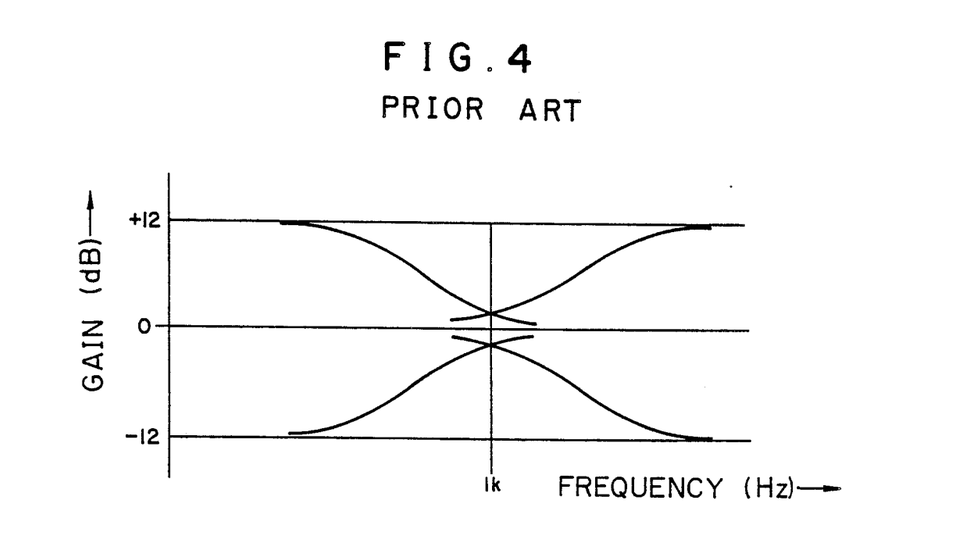
FIG. 4 is a diagram showing the frequency characteristics of the circuit shown in FIG. 2.

FIG. 4 is a diagram showing the change of typical frequency characteristics of the bass/treble type tone control circuit of the type shown in FIG. 2, wherein the gains of the high frequency band as well as the low frequency band are adjustable from the maximum of 12 dB to the minimum of −12 dB at the upper and lower sides of 1 KHz.

Figure 5:
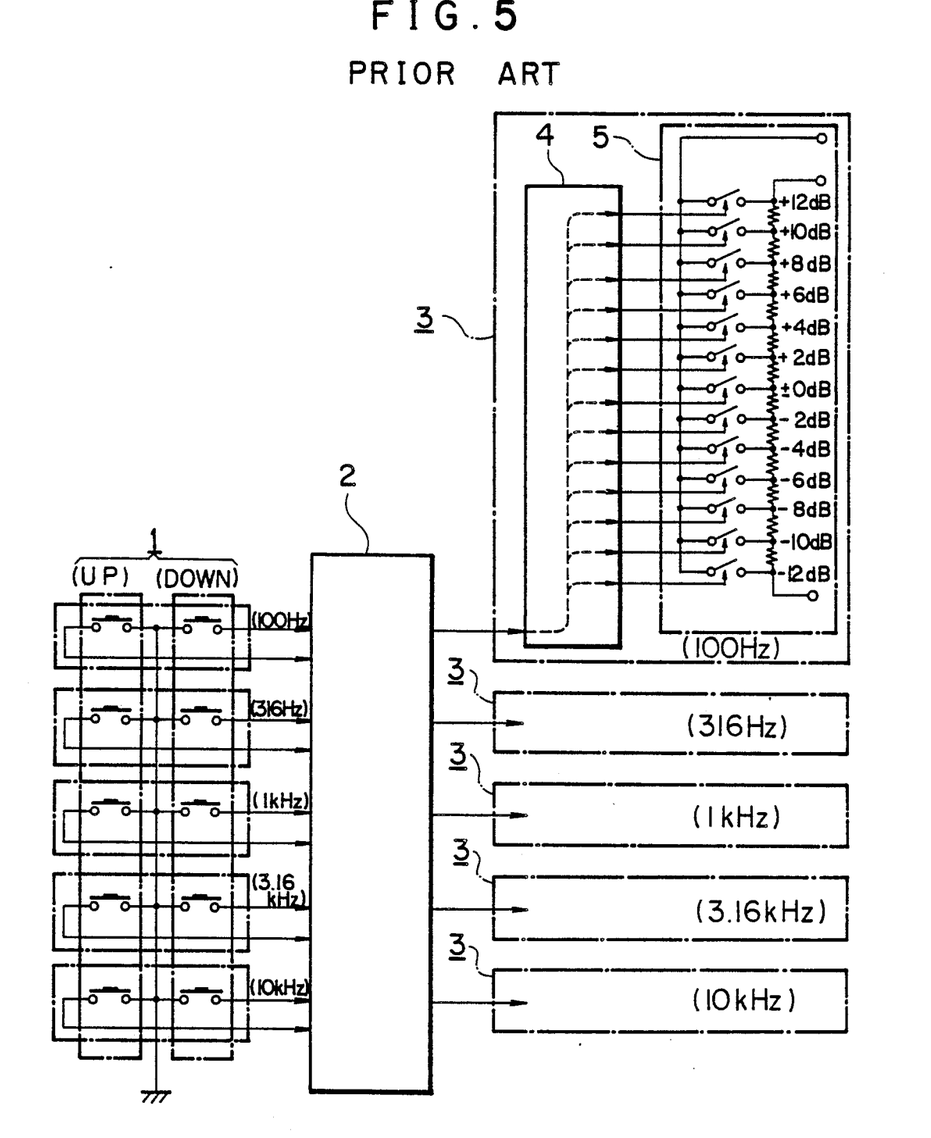
FIG. 5 is circuit diagram showing a circuit for electronic variable resistors of a prior art graphic equalizer.

There is another type of prior art graphic equalizer different from the one shown in FIG. 1 in that electronic variable resistors are utilized instead of the variable resistors VR1-VR5. A circuit diagram of such a graphic equalizer having electronic variable resistors is shown in FIG. 5, wherein numeral 1 denotes a manipulation input section which is externally manipulative via keyboard entry to increase (UP) or decrease (DOWN) the gain level of each of the five bands having the center frequency of 100 Hz, 316 Hz, 1 KHz, 3.16 KHz, and 10 KHz respectively. Numeral 2 denotes a digital processing unit of the type known as a microcomputer in the art, and numeral 3 denotes an electronic variable resistor assembly provided for each of the five bands and the resistance of which is varied in accordance with a command from the microcomputer 2. The electronic variable resistor assembly 3 consists of an interface circuit 4 and an electronic variable resistor unit 5. The electronic variable resistor unit 5 further includes an array of resistors and an array of electronic switches each connected to every junction of the array of resistors for being switched by outputs of the interface circuit 4.

As for the UP/DOWN keyboard input at the manipulation input section 1, one valid input may vary the gain by amount of +2 dB or −2 dB in the respective band. The digital processing unit 2 scans the manipulation input section 1 for checking the existence of keyboard operation at all times. Upon detecting the key board operation of an UP key (or DOWN key) assigned to a selected band, the digital processing unit 2 sends out new gain setting data to the interface unit 4 in accordance with a protocol, which turns on electronic switches that correspond to an amount of variation required in the electronic variable resistor assembly 5 after adding +2 dB (or −2 dB) to the current gain setting data in a memory for the selected band. It is obvious that the electronic switches which have been turned ON should be cleared to turn OFF prior to being turned ON in the above mentioned operation. The digital processing unit 2 is so arranged as to invalidate keyboard input that causes the change of gain to be over +12 dB or under −12 dB.

As a characteristic of the graphic equalizer, if the number of divided frequency bands is increased, the frequency characteristic may be made flatter after compensating. However, more keyboard input operations would also be required for increasing or decreasing the gain across wide frequency bands for tone control.

On the other hand, in a bass/treble tone control circuit that requires only two frequency bands in the audio frequency range, very quick input operation is possible because only a few manipulations at the input section are required for tone control. In addition, owing to the fact that the gain is varied across wider frequency bands for tone control, there is a high probability of having strong spectra of voice, music and the like within these frequency bands. Therefore the effect of changing an amount of input at the input section can easily be detected by monitoring the sounds during the input operation, resulting in very few errors due to misjudgment in the determination of the desired amount of input as compared to the graphic equalizer. For compensation of dips or peaks in the frequency characteristic of speakers, however, the satisfactory compensation is not attained most of time with this type of tone control.

Accordingly, the use of finely divided frequency bands makes manipulation more difficult and the use of coarsely divided frequency bands results in lessened ability to control compensation of frequency characteristic in the prior art tone control devices.

In car audio equipment, it is especially desirable to have a high degree of compensating ability due to the peculiar acoustic environment while permitting control through the the simplest manipulation, due to safety concerns. In a tone control device to satisfy these problems, it is desirable to furnish a device having a tone compensating capacity for multi-frequency bands as in the graphic equalizer, together with simple tone control manipulation means such as in the bass/treble tone control circuit. In tone control devices of this type, there have been such problems that the manipulation input section has been complicated by the installation of switches and levers which are not necessary at all times and the scale of circuitry has been enlarged with the installation of two types of circuits for the tone control. Further, the operation of the manipulative input section of the graphic equalizer with the intent of compensation necessitates brining the frequency characteristic being set to a favorable tone by the bass/treble tone control manipulation back to the flat characteristic causing complicated problems in the operation.

It is, therefore, an object of this invention to solve the above-mentioned problems and to provide a tone control device capable of performing the combined functions of fine compensation for frequency characteristic as in the graphic equalizer and simple manipulation for tone control as in the bass/treble tone control circuit by making use of corresponding circuits in common to both without increasing the scale of circuitry.

SUMMARY OF THE INVENTION

According to the present invention, the audio frequency range is initially divided into N and M ($<N$) bands and a first manipulation input is fed to each one of the N bands by means of a first manipulation input means while the second manipulation input is fed to each one of the M bands by means of a second manipulation input means. The second manipulation input is converted into weights for each band in the N bands as in the form of increasing or decreasing respective gain thereof by using a conversion means and setting the gain of each band in the N bands by utilizing a gain setting means in accordance with the amount of the first manipulation input as well as the weighted gain, hence variable resistance values of the electronic variable resistor assembly are varied respectively in order to attain the set gains.

Further, in accordance with this invention, since the second manipulation input is converted into the weights to be assigned for each band in the N bands as in the form of an increase or decrease of gain, the gain setting data for each band in the N bands can be obtained collectively from the first manipulation input and the weighted gain converted from the second manipulation input in order to adjust the gain thereof, therefore, the variable resistances in the electronic variable resistor assembly can be adjusted collectively in accordance with the gain setting data.

DESCRIPTION OF THE PREFERRED EMBODIMENTS

Figure 6:
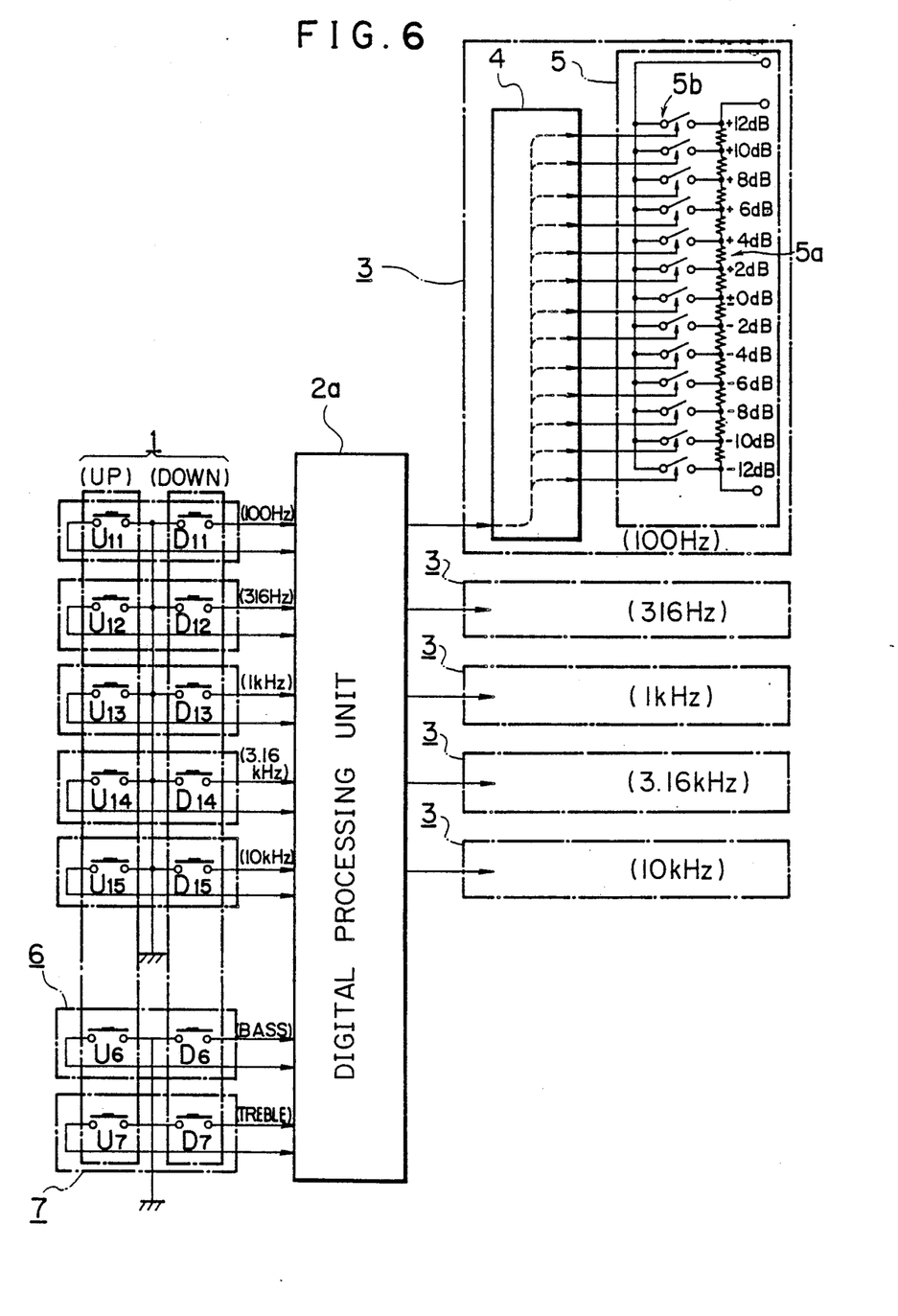
FIG. 6 is a circuit diagram showing a circuit for electronic resistors of a tone control device in accordance with a first embodiment of this invention.

The present invention will now be described in more detail with reference to the accompanying drawings. Referring now to FIG. 6, there is shown a circuit diagram of electronic variable resistors which constitutes a main part of the tone control device embodying the present invention. The numerals 1, 3-5 identify like elements in the prior art graphic equalizer shown in FIG. 5. U11-U15 and D11-D15 denote UP keys and DOWN keys respectively in the manipulation input section, wherein each of them are paired and are grounded at one end and the other ends are connected to respective input ports of the digital processing unit 2a which is consisted, for instance, of a microcomputer. The digital processing unit 2a operates in accordance with the flowchart shown in FIG. 7 and is connected to the respective interface units 4 contained in each of the five electronic variable resistor assemblies 3 assigned to five bands having center frequencies of 100 Hz, 316 Hz, 1 KHz, 3.16 KHz and 10 KHz, respectively thereof. Each electronic variable resistor assembly 3 is composed of the interface unit 4 and the electronic variable resistor member 5. The electronic variable resistor member 5, in turn, is composed of a resistor array 5a of twelve series-connected fixed resistors each of which has a resistance varying 2 dB in gain and an electronic switch array 5b of thirteen electronic switches led out from junctions of the resistor array 5a (including junctions between resistors and the terminal formed at both ends) to be switched under the control of outputs derived from the interface unit 4. The numeral 6 denotes a bass UP/DOWN input section made up of a pair of UP key U6 and DOWN key D6 to provide an instruction for increasing or decreasing the gain in a lower frequency range. The numeral 7 denotes a treble UP/DOWN input section made up of a pair of UP key U7 and DOWN key D7 to provide an instruction for increasing or decreasing the gain in a higher frequency range. These UP keys U6, U7 and down keys D6, D7 are connected to ground at one end thereof and are connected to input ports of the digital processing unit 2a at the other end thereof. The electronic variable resistor assemblies 3 replace the variable resistors VR1-VR5 in the prior art circuit shown in FIG. 1. Therefore, the the two ends of each resistor array 5a are connected to the "+" and "−" input terminals of the operational amplifier OP1 respectively and the common terminal of each electronic switch array 5b is connected to the end of each of the associated resonance circuits RC1-RC5.

Figure 7:
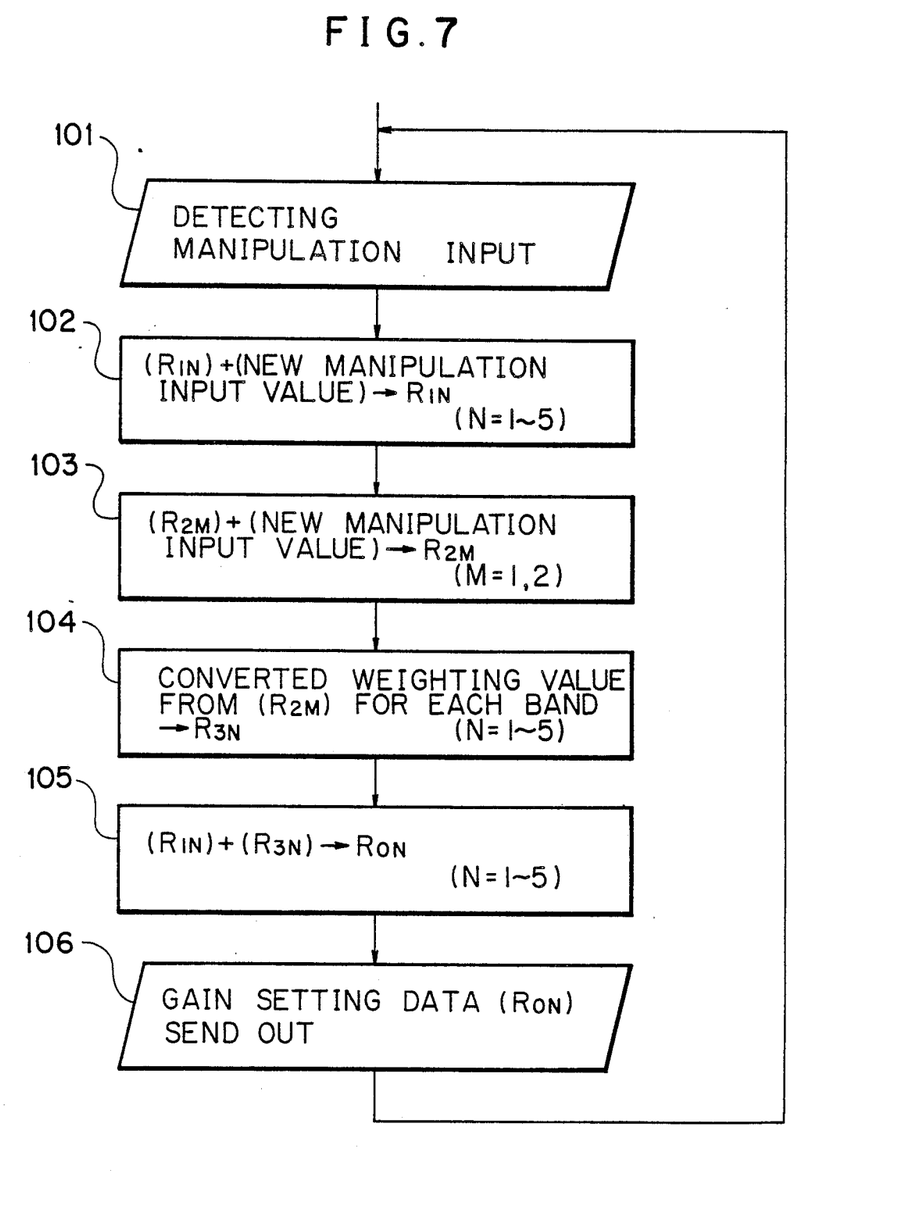
FIG. 7 is a flowchart showing the operation at the digital processing unit of the embodiment shown in FIG. 6.
Figure 8:
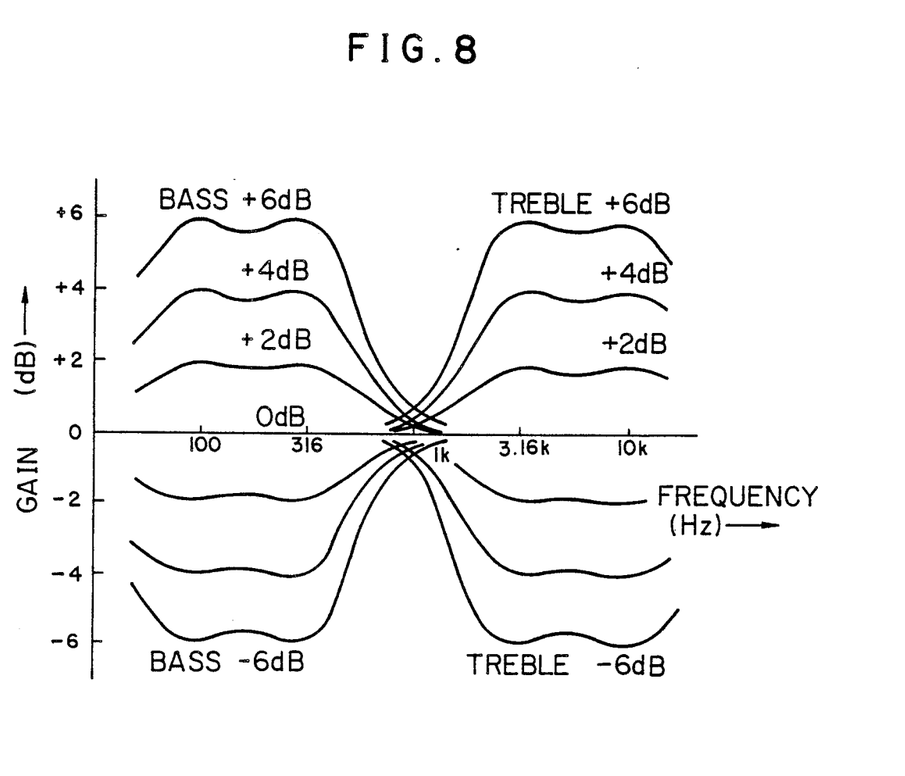
FIG. 8 is a diagram showing the frequency characteristic of a bass/treble tone control device.

The operation of the tone control device will now be described by referring to FIG. 6 and FIG. 7. In each of the following steps to be described hereinafter, it should be understood that the operation will be performed for every band in the five bands. At step 101, a manipulation input is detected by scanning the manipulation input section 1, the bass UP/DOWN input section 6 and the treble UP/DOWN input section 7. At step 102, a new manipulation input value for the Nth graphic equalizer is stored in a register R1N in the digital processing unit after being renewed by adding a new manipulation input value detected by scanning at the manipulation input section 1 t the corresponding current content [R1N] stored in the Nth band register R1N, whereby the "N" is coded 1, 2, . . . 5 in order from the lower end band amongst the divided bands having the center frequencies of 100 Hz, 316 Hz, 1 KHz, 3.16 KHz and 10 KHz. At step 103, a new bass manipulation input value is stored in a register R21 in the digital processing unit after being renewed by adding a new manipulation input value detected by the scanning at the bass UP/DOWN input section 6 to the bass manipulation input value [R21] stored in the register R21. In a similar manner, a new treble manipulation input value is stored in a register R22 after being renewed by adding a new manipulation input value detected by scanning at the treble UP/DOWN input section 7 to the content [R22] stored in the register R22. In FIG. 7, R2M denotes the respective register (where M = 1, 2) and [R2M] denotes the respective contents thereof. At step 104, the renewed data [R2M] of the higher and the lower bands are stored in the register R3N after being converted into weighting values for varying the gain of the 5 bands. In other words, an amount of variation xdB for bass tone is converted into xdB for the bands having the center frequencies of 100 Hz and 316 Hz, similarly, an amount of variation ydB for treble tone is converted into ydB for the bands having the center frequencies of 3.16 KHz and 10 KHz. The frequency characteristics for the variations of the bass/treble type tone control to be attained by this approximation are shown in FIG. 8.

Referring again to the flowchart, at step 105, the manipulation input value [R1N] for the Nth band and the corresponding converted weighting value [R3N] thereto are added and the result is stored in a register R0N as gain setting data for the Nth band (where N=1-5). Finally, at step 106, the gain setting value for the Nth band which is the content [R0N] of the register R0N is fed to the electronic variable resistor assembly 3 which is assigned for the Nth band. The program then returns to the initial step and repeats steps 101 through 106.

Each electronic variable resistor assembly 3 accepts the gain setting data for the associated band at the interface unit 4 and only one electronic switch in the electronic switch array 5b is turned ON by the output of interface unit 4 for providing the gain that corresponds to the received gain setting data.

In the embodiment of this invention as described above, one manipulation of any one of the UP keys U11-U15, U6, and U7 corresponds to +2 dB in gain and one manipulation of any one of the DOWN keys D11-D15, D6 and D7 corresponds to −2 dB in gain. Therefore, by repeating manipulations of one key in either of the UP or DOWN keys in a successive manner, the gain of the band to which the manipulated key is assigned can be controlled as many times as the keys are depressed. However, since there is a limit for the gain setting data not to exceed a variable gain range of +12 dB, the gain setting data should be limited to less than a certain value but the description to this matter will no longer be discussed herein.

Figure 9A:
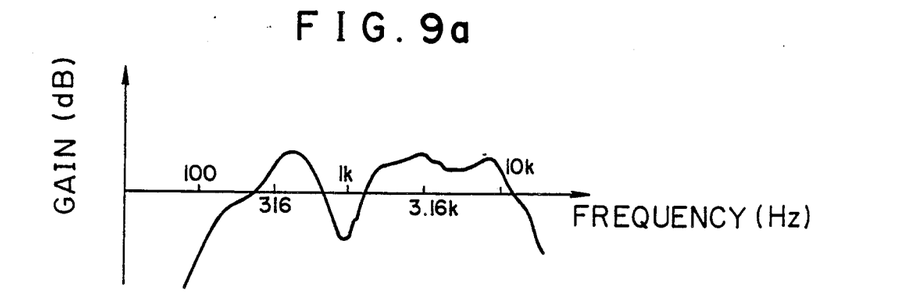
FIGS. 9a through 9e are diagrams showing the changes in the frequency characteristics of the circuit of the first embodiment shown in FIG. 6.
Figure 9B:
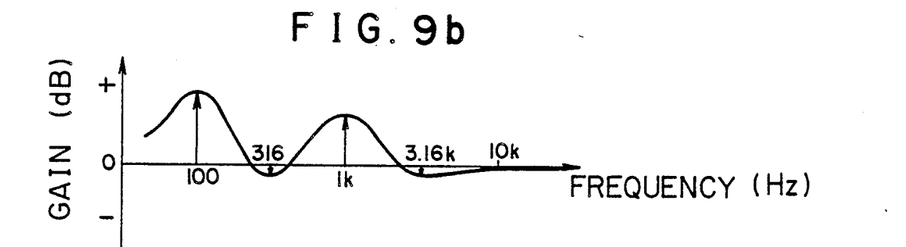
Figure 9C:
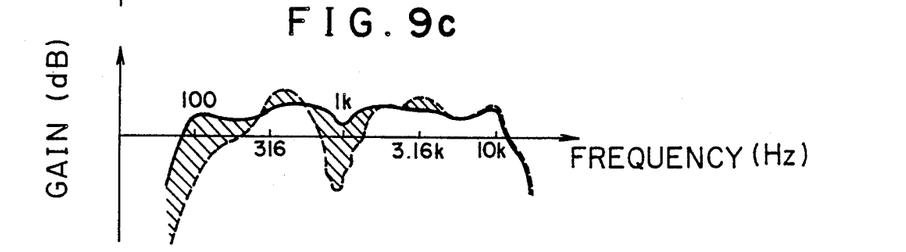
Figure 9D:
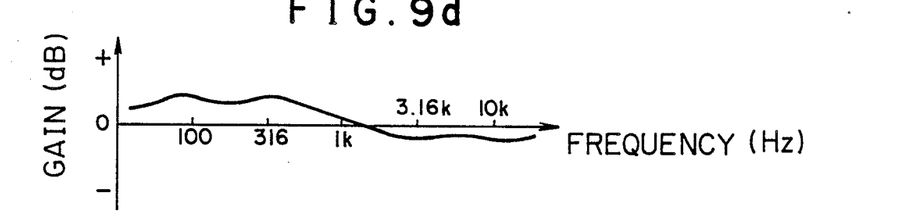
Figure 9E:
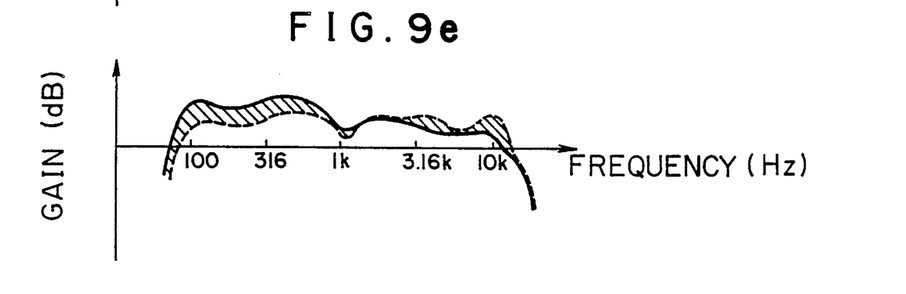

In the following, the results of tone control in accordance with the embodiment of this invention will be described with the aid of diagrams of FIGS. 9a-9e. FIG. 9a shows a frequency characteristic when no tone control is used for sounds from a music source to a speaker audio output. FIG. 9b illustrates the input characteristic for graphic equalization which is determined to flatten the rough frequency characteristic of FIG. 9a. FIG. 9c illustrates the compensated frequency characteristic obtained by compensating the frequency characteristic of FIG. 9a by the graphic equalization of FIG. 9b (where the broken line denotes the original frequency characteristic of FIG. 9a). FIG. 9d illustrates input characteristics for bass/treble tone control to obtain a desired tone in music. FIG. 9e illustrates the modified frequency characteristic in the form of acoustic output obtained by modifying the frequency characteristic of FIG. 9c by the bass/treble tone control of FIG. 9d (where the broken line denotes the frequency characteristic of FIG. 9c).

The second embodiment of this invention will now be described. The second embodiment has a hardware structure similar to that of the first embodiment except for the digital processing unit which performs steps in accordance with the flowchart of FIG. 10.

Figure 10:
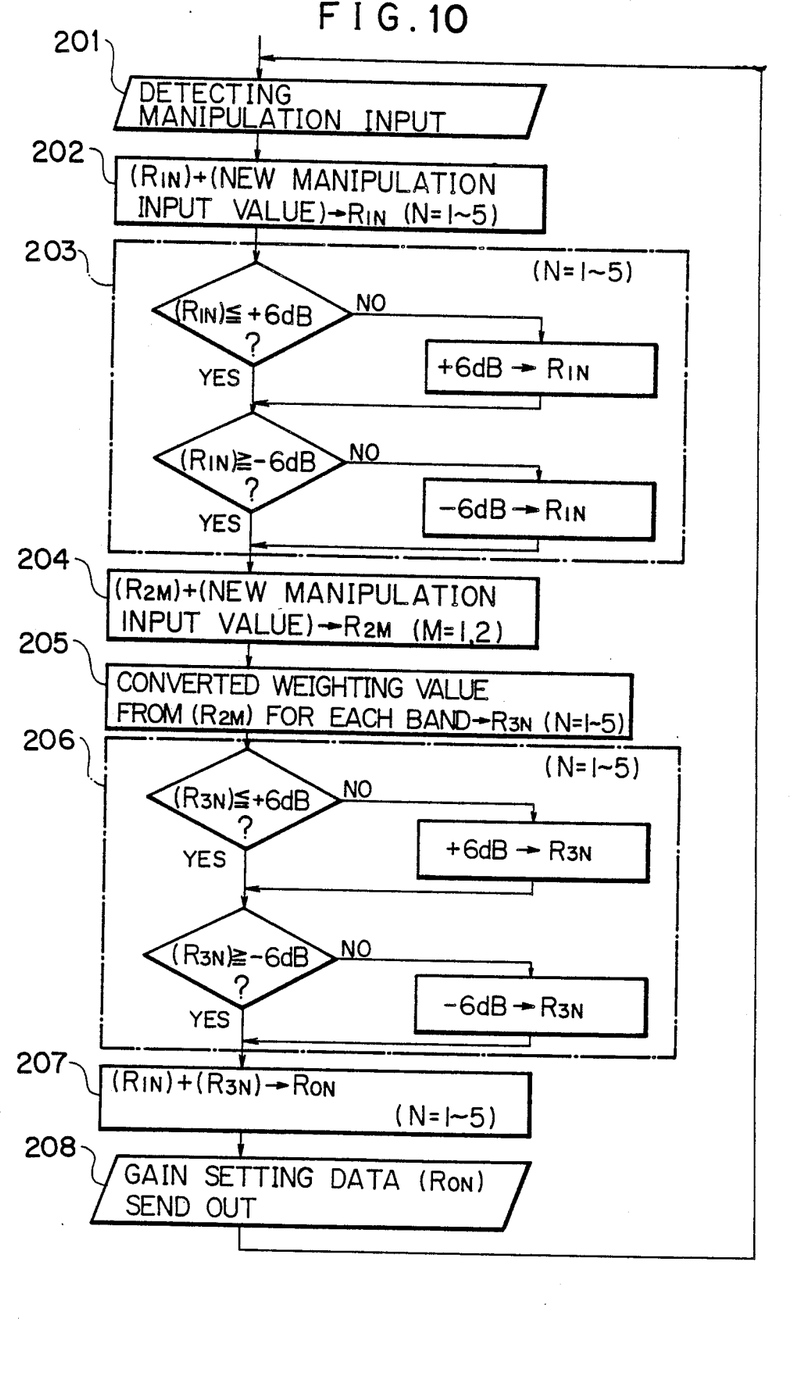
FIG. 10 is a flowchart showing the operation at the digital processing unit of a second embodiment of this invention.

In the flowchart of FIG. 10, the description is made on the assumption that the same processing is performed for each band in the five bands. Initially at step 201, a manipulation input is detected by scanning. At step 202, a new graphic equalizer input value is stored in a register R1N after being renewed by adding a newly detected manipulation input value of the Nth band to the content [R1N] stored in the Nth band register R1N (where N=1-5). At step 203, the renewed graphic equalizer input value is then checked to determine whether the new graphic equalizer input value [R1N] is within a gain range of −6 dB−+6 dB. If the value is within the gain range of −6 dB−+6 dB then the value remains as is, however, if the value is over +6 dB or below −6 dB then the value is limited to +6 dB or −6 dB respectively and stored in the register R1N as a revised value. At step 204, renewals of bass manipulation input value and treble manipulation input value are performed by adding new bass/treble manipulation inputs to the contents [R2M] stored in the registers R2M respectively (where M =1, 2). At step 205, the contents [R2M] stored in the registers R2M are converted into weighting values for varying the gain of each band and the converted weighting values are stored in the respective band register R3N. At step 206, the stored converted weighting value [R3N] is then checked to determine whether the content [R3N] is within a gain range of −6 dB−+6 dB. If the content [R3N] is within the range then it remains as is, however, if the content [R3N] is over +6 dB or below −6 dB, then it is limited respectively to +6 dB or −6 dB and stored in the respective registers R3N (N=1-5) accordingly. At step 207, a Nth band gain setting data is stored in the register R0N after being renewed by adding the graphic equalizer input value [R1N] associated with the Nth band to the converted weighting value [R3N] for the same band. At step 208, the gain setting data [R0N] which is the content of the register R0N is transmitted for setting the gain of each band. After processing the step 208, the program is returned to the initial step of 201 and the steps 201-208 as described above are repeated.

In accordance with the second embodiment of this invention, the steps 203 and 206 are additionally included for limiting the input values because if either of the graphic equalizer input value or the bass/treble input value occupies the full or substantially full variable range of +12 dB the other is not allowed to vary within the range.

Figure 11:
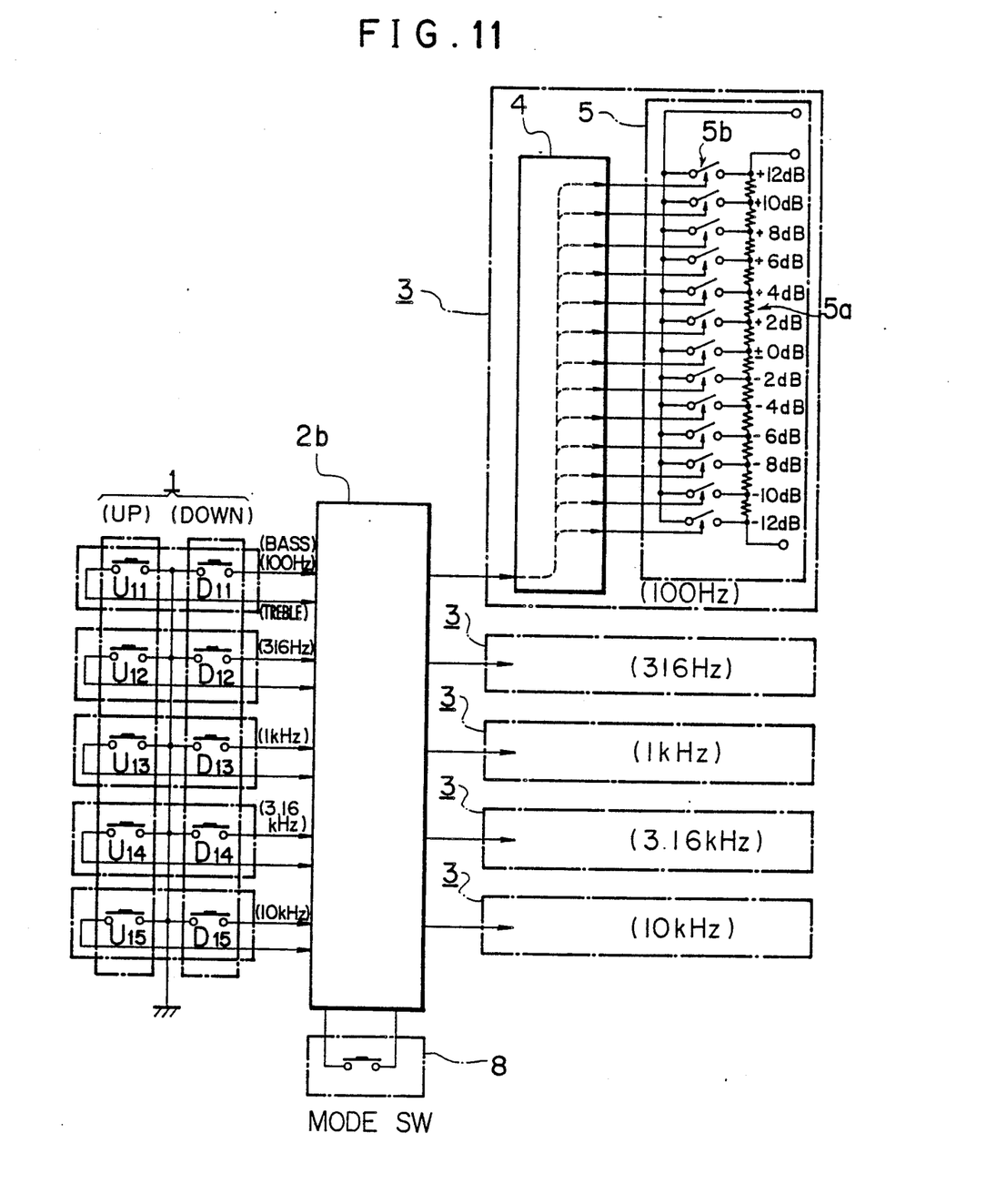
FIG. 11 is a circuit diagram showing a circuit for electronic variable resistors of a tone control device in accordance with a third embodiment of this invention.
Figure 12:
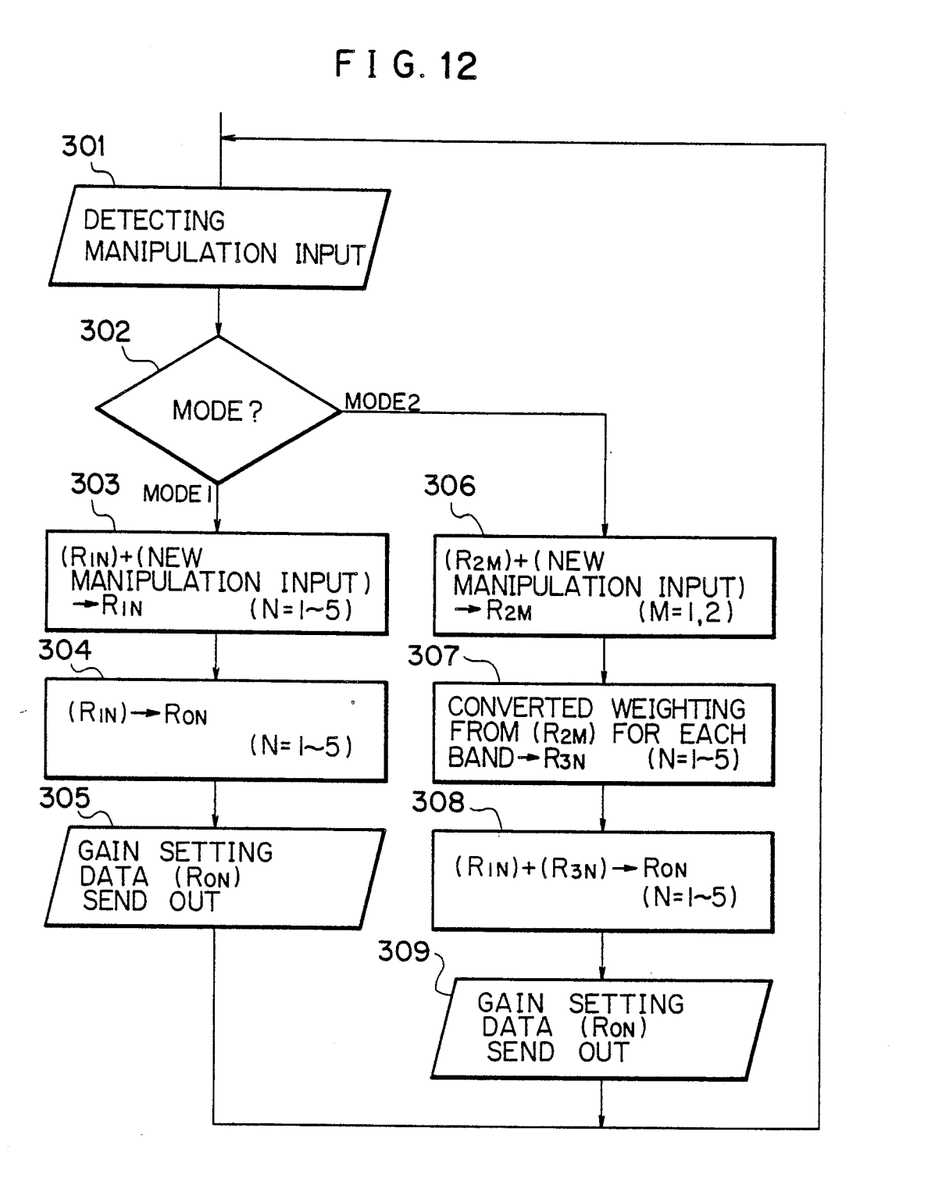
FIG. 12 is a flowchart showing the operation of the digital processing part of the third embodiment of the invention shown in FIG. 11.

Referring now to FIG. 11, there is shown an electronic variable resistor unit which constitutes a main part of a third embodiment of this invention. The third embodiment differs from the first embodiment in the following repects. A microcomputer 2b which executes steps in accordance with the flowchart of FIG. 12 is utilized instead of the microcomputer 2a in the first embodiment. A mode switch 8 is mounted at the input port of the microcomputer 2b instead of the bass UP/DOWN input section 6 and the treble UP/DOWN input section 7 for selecting a graphic equalizer manipulation input mode or a bass/treble manipulation input mode. An UP key U11 and a DOWN key D11 for the band having the center frequency of 100 Hz are commonly used with an UP key and a DOWN key for the base tone control and, similarly, an UP key U12 and a DOWN key D12 for the band having the center frequency of 316 Hz are commonly used with an UP key and a DOWN key for the treble tone control. The rest of the circuit components are the same as that of the first embodiment and the numerals 1, 3-5 denote the like elements in the first embodiment of FIG. 6.

The operation of the third embodiment of this invention will now be described by referring to FIG. 11 and FIG. 12. In FIG. 12, there is shown a flow chart implemented by the microcomputer adapted in the third embodiment. At step 301, a manipulation input is detected by scanning the manipulation input section 1. At step 302, a mode of the detected input is evaluated to determine whether it is the graphic manipulation input mode (mode 1) or the bass/treble manipulation input mode (mode 2) by detecting ON (for mode 1) or OFF (for mode 2) position of the switch 8. If the mode is mode 1, a graphic equalizer input value is stored in the Nth band register R1N at step 303 after being renewed by adding the newly detected manipulation input value of the Nth band to the latest content [R1N] stored in the Nth band register R1N. At step 304, the new content [R1N] in the register R1N is transferred to the register R0N as a gain setting data. At step 305, the gain setting data [R0N] stored in the Nth band register R0N is transmitted to the Nth band electronic variable resistor assembly 3, which in response turns ON only one switch of the electronic switch array 5b through the interface unit 4 for setting the gain to conform to the gain setting data [R0N]. After processing the step 305, the program returns to the initial step 301.

On the other hand, if the mode is mode 2, bass/treble input values are stored in the respective register R2M after being renewed by adding the newly detected bass/treble manipulation input values to the respective contents [R2M] stored in the registers R2M (where M=1, 2). At step 307, the contents [R2M] stored in the registers R2M are converted into weighting values for varying the gain of each band and the converted weighting values are stored in the respective registers R3M. At step 308, gain setting data is stored in the register R0N as the Nth band gain setting data [R0N] after being set by adding the graphic equalizer input value [R1N] stored in the Nth band register R1N to the converted weighting value [R3N] stored in the Nth band register R3N. At step 309, the content [R0N] stored in the register R0N which is the gain setting data is transmitted to the Nth band electronic variable resistor assembly 3 for setting the gain to conform to the gain setting data [R0N]. After processing the step 309, the program is returned to the initial step of 301 and the steps 301-309 are repeated.

In the foregoing specification, the invention has been described with reference to specific exemplary embodiments, more specifically, to the five-band graphic equalizer and the bass/treble tone control devices. It will, however, be evident that various modifications and changes may be made without departing from the spirit or the scope of this invention, for example, the tone controlling may be applied to three bands or more besides the bass/treble control (the number of bands should be less than that of graphic equalizer) or one of the tone control bands may be so designed to have the identical frequency characteristic to that of one frequency band of the five-band graphic equalizer.

According to this invention, as described above, the input section is easy to operate and requires no enlargement of the circuit scale resulting in cost benefits and further solving the contradictory problem of dividing the audio frequency band into a large number of bands for the graphic equalizer and simultaneously employing bass/treble tone control circuits in accordance with the prior art.

There may be added to the embodiments as described above such a function, for example, as that of enabling the frequency characteristics entered by an operator to be stored semi-permanently in the digital processing unit and enabling the gain setting for each band to be done by reading out a specific frequency characteristic therefrom by utilizing a readout command.

Further, there may also be added to the embodiments above a function of enabling a plurality of frequency characteristics to be memorized beforehand by non-volatile memories or wiring connections and enabling the gain setting for each band to be done by reading out a specific frequency characteristic therefrom by utilizing a read out command similar to the above.

It will appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A tone control device comprising:
   a first manipulation input means for entering first manipulation inputs to adjust a gain of each of N bands of an audio frequency band;
   a plurality of memory means for storing the first manipulation inputs by the first manipulation input means after converting the first manipulation inputs into digital values;
   a plurality of electronic variable resistor assemblies for varying each resistance in accordance with gain setting data for each band in the N bands;
   wherein an audio signal is controlled in tone on a basis of frequency characteristics that corresponds to the gain setting data fed to each band in the N bands; and characterized by further comprising:
   a second manipulation input means for entering second manipulation inputs to adjust a gain of each of M bands of the audio frequency band, M being less than N;
   a conversion means for converting the second manipulation inputs by the second manipulation input means into converted weighting values for each band in the N bands; and
   a gain setting means for setting a gain of the each band in the N bands in accordance with the converted weighting values and the first manipulation inputs stored in the memory means.

2. A tone control device as defined in claim 1, wherein the first manipulation input means is for graphic equalizing.

3. A tone control device as defined in claim 1, wherein the second manipulation input is for bass/treble tone controlling.

4. A tone control device as defined in claim 1, wherein the first manipulation inputs are added respectively to the stored current input values for renewing.

5. A tone control device as defined in claim 1, wherein the second manipulation inputs are added respectively to the stored current input values for renewing.

6. A tone control device as defined in claim 4, wherein the renewed first manipulation input values are limited to be within a predetermined gain range.

7. A tone control device as defined in claim 5, wherein the renewed second manipulation input values are limited to be within a predetermined gain range.

8. A tone control device as defined in claim 1, 2, 3, 4, 5, 6 or 7, and further including a mode discriminating switch for discriminating the first and second manipulation inputs.

9. A tone control device as defined in claim 8, wherein switches are commonly used for entering the first manipulation inputs to certain bands and the second manipulation inputs to said M bands.

10. A tone control device as defined in claim 1, wherein the N bands are five bands having center frequencies of 100 Hz, 316 Hz, 1 KHz, 3.16 KHz and 10 Hz, respectively.

11. A tone control device as defined in claim 1, wherein the M (<N) bands are bass and treble bands.

12. A tone control device as defined in claim 1, wherein the M (<N) bands are three or more bands other than bass/treble bands.

13. A tone control device as defined in claim 11, wherein one of the M bands is so selected that the frequency characteristic thereof is to be identical to that of one band in the N bands.

14. A tone control device as defined in claim 1, wherein frequency characteristics entered by the first manipulation input means are semi-permanently stored for gain setting at discretion in the gain setting means.

15. A tone control device as defined in claim 1, and further including a means for providing a plurality of frequency characteristics by making use of non-volatile memories or wiring connections for gain setting at discretion in the gain setting means.

* * * * *